(12) United States Patent
Subba et al.

(10) Patent No.: US 7,932,103 B2
(45) Date of Patent: Apr. 26, 2011

(54) INTEGRATED CIRCUIT SYSTEM WITH MOS DEVICE

(75) Inventors: Niraj Subba, Sunnyvale, CA (US); Jung-Suk Goo, Los Altos, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 50 days.

(21) Appl. No.: 11/680,568

(22) Filed: Feb. 28, 2007

(65) Prior Publication Data

US 2008/0204052 A1 Aug. 28, 2008

(51) Int. Cl.
*G01R 31/26* (2006.01)
(52) U.S. Cl. ............... 438/14; 438/11; 438/17; 438/19; 324/686; 257/48
(58) Field of Classification Search .................. 324/686; 438/14; 257/374
See application file for complete search history.

(56) References Cited

U.S. PATENT DOCUMENTS

| | | | |
|---|---|---|---|
| 6,169,302 B1* | 1/2001 | Long et al. | 257/288 |
| 6,539,526 B1* | 3/2003 | Deng | 716/115 |
| 6,838,869 B1 | 1/2005 | Rogers et al. | |
| 6,906,548 B1 | 6/2005 | Toshiyuki et al. | |
| 6,964,875 B1* | 11/2005 | En et al. | 438/14 |
| 6,980,009 B2 | 12/2005 | Maciejewski et al. | |
| 7,132,683 B1* | 11/2006 | Krishnan et al. | 257/40 |
| 7,176,706 B2 | 2/2007 | Toshiyuki et al. | |
| 7,405,090 B2* | 7/2008 | Jang | 438/14 |
| 2005/0085932 A1* | 4/2005 | Aghababazadeh et al. | 700/90 |

* cited by examiner

*Primary Examiner* — Melissa J Koval
*Assistant Examiner* — Benjamin M Baldridge
(74) *Attorney, Agent, or Firm* — Farjami & Farjami LLP

(57) ABSTRACT

An integrated circuit system includes measuring capacitance for a base structure between a base gate and a base connector thereof, measuring capacitance for a test structure between a test gate and a test connector thereof, the test structure having the test gate, a test dielectric, and the test connector with the test dielectric extending thereunder, and determining a difference between the capacitances of the base structure and the test structure to determine parasitic capacitance for the base structure between the base gate and the base connector thereof.

20 Claims, 3 Drawing Sheets

INTEGRATED CIRCUIT SYSTEM WITH MOS DEVICE

TECHNICAL FIELD

The present invention relates generally to integrated circuit systems and more particularly to a system for an integrated circuit with MOS device.

BACKGROUND ART

As electronic devices become more pervasive in our daily lives, the need for higher volumes and tighter quality control continues to increase. Electronics devices, such as computer systems or cellular phones, rely on microelectronic devices for their key functions and features. Microelectronic devices, such as semiconductor chips, are typically fabricated with defined production flows. The intention is that production flows processed on different combinations of components will each produce batches of identical products. Typically, each of these products is made by utilizing a multitude of recipes, where each recipe may be thought of as a set of predefined process parameters required for a reproducible processing outcome.

Semiconductor chips include millions of metal-oxide-semiconductor (MOS) devices, such as MOS field effect transistors (MOSFET) or MOS transistors. Predicting performance, such as in characterization, of MOS transistors is critical to validating or verifying the integrated circuit design for a manufacturing process. The circuit design is compared to actual integrated circuit devices to ensure a working resulting integrated circuit device. Capacitance-voltage measurement is fundamental to determining the device performance of the MOS transistors. As manufacturing processes and technologies are improved, the device sizes of the MOS transistors continue decreasing as well as the transistor's gate insulation or gate oxide becoming thinner.

The thinner gate oxide has caused gate capacitance or load much more difficult to determine. A thinner insulator in a MOS transistor results in exponential increases in stray current, such as direct tunneling leakage current, and forces opposing transistor switching, such as parasitic capacitances of the MOS device. These extreme increases in inefficiencies of the MOS transistor can no longer be ignored. Producing expected integrated circuits has become increasingly difficult and unpredictable. Instead of producing more integrated circuit devices, the difficulty in designing predictable integrated circuit devices has resulted in fewer of the integrated circuit devices that meet the performance or functions required.

Attempts to predict performance of the MOS transistor have included adjustments to extracted data, such as parametric data, and software applications, such as integrated circuit simulators. These adjustments only address the symptoms and do not address the cause, so the adjustments introduce additional variability and inaccuracies. The additional variability and inaccuracies result in more if not all inoperable integrated circuit devices and/or significantly larger integrated circuit device dimensions thereby eliminating the benefits of improved, smaller technologies. Other unsuccessful attempts to predict performance have included integrated circuit testing strategies requiring higher cost, increased time, larger area, or additional complexity.

Thus, a need still remains for an integrated circuit system to improve integrated circuit modeling, performance, and size. In view of the ever-increasing commercial competitive pressures, coupled with the technical imperatives of improved die-to-die variation and improved production efficiency, it is critical that answers be found for these problems. Competitive pressures also demand lower costs alongside improved efficiencies and performance.

Solutions to these problems have been sought but prior developments have eluded those skilled in the art.

DISCLOSURE OF THE INVENTION

The present invention provides measuring capacitance for a base structure between a base gate and a base connector thereof, measuring capacitance for a test structure between a test gate and a test connector thereof, the test structure having the test gate, a test dielectric, and the test connector with the test dielectric extending thereunder, and determining a difference between the capacitances of the base structure and the test structure to determine parasitic capacitance for the base structure between the base gate and the base connector thereof.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
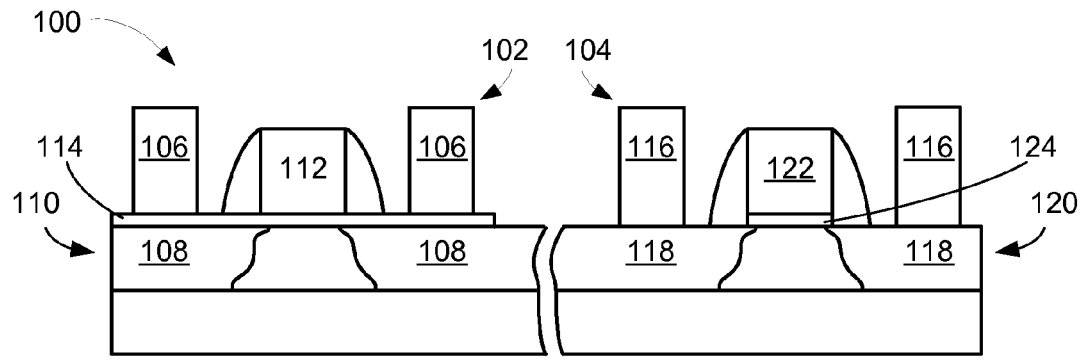
FIG. 1 is a cross-sectional view of an integrated circuit system in an embodiment of the present invention.

The following embodiments are described in sufficient detail to enable those skilled in the art to make and use the invention. It is to be understood that other embodiments would be evident based on the present disclosure, and that system, process, numerical, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, mathematics, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a cross-sectional view of an integrated circuit system 100 in an embodiment of the present invention. The integrated circuit system 100 includes a test structure 102 and a base structure 104. The test structure 102 provides isolation of test connectors 106, such as contacts, from test source/drain regions 108 of a test body 110, such as a silicon body. The test connectors 106 and a test gate 112 can be formed over a test dielectric 114 such as a grown gate oxide. The test dielectric 114 can be formed over the test body 110. The test structure 102 can also be formed without applying a silicidation process over the test source/drain regions 108 providing improved matching between the test structure 102 and the base structure 104.

The base structure 104 includes base connectors 116, such as contacts, connected to base source/drain regions 118 of a base body 120, such as a silicon body. A base gate 122 can be formed over a base dielectric 124, such as a grown gate oxide. The base dielectric 124 can be formed between the base source/drain regions 118. The base connectors 116 can be formed on the base source/drain regions 118 and having substantially the same dimensions and composition as the test connectors 106. The base source/drain regions 118 can optionally be formed substantially the same as the test source/drain regions 108.

Figure 2:
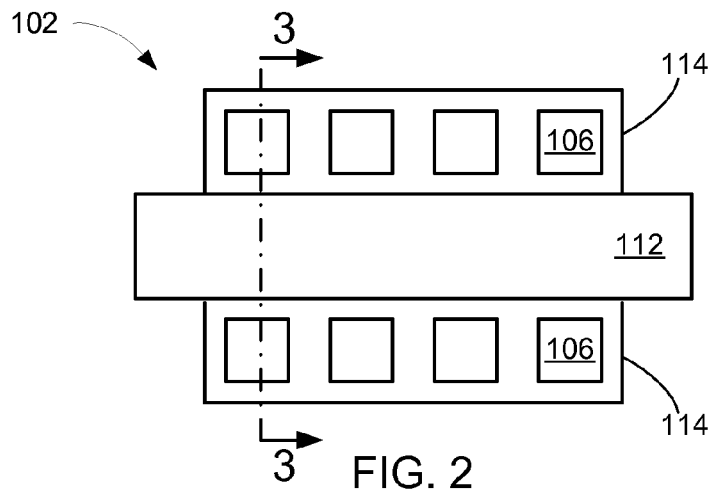
FIG. 2 is a plan view of the test structure of the integrated circuit system.

Referring now to FIG. 2, therein is shown a plan view of the test structure 102 of the integrated circuit system 100. The test structure 102 includes the test connectors 106 over the test dielectric 114. The test connectors 106 are formed having substantially the same dimensions and density as the base connectors 116 of FIG. 1. The test structure 102 also includes the test gate 112 formed substantially between the test source/drain regions 108.

The test gate 112 is formed having substantially the same dimensions as the base gate 122 of FIG. 1. The test gate 112 and the test connectors 106 are formed over the test dielectric 114. The test connectors 106 can be connected to interconnect (not shown), such as routing, having substantially the same dimensions as interconnect connected to the base connectors 116. The test structure 102 provides extracted capacitance between the test gate 112 and the test connectors 106 including interconnect (not shown).

Figure 3:
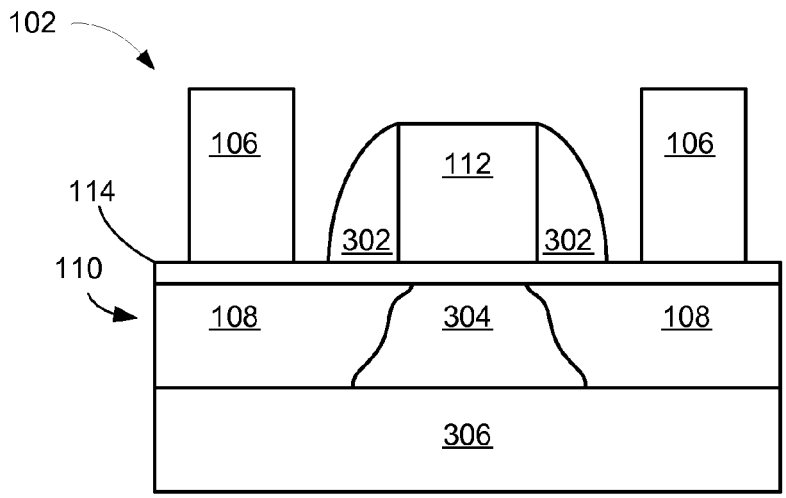
FIG. 3 is a cross-sectional view of the test structure along line segment 3-3 of FIG. 2.

Referring now to FIG. 3, therein is shown a cross-sectional view of the test structure 102 along line segment 3-3 of FIG. 2. The test structure 102 includes the test connectors 106 over the test dielectric 114 and the test source/drain regions 108 of the test body 110. The test gate 112 can be formed over the test dielectric 114 and substantially between the test source/drain regions 108. Test spacers 302, such as sidewall spacers can optionally be formed adjacent to the test gate 112. The test spacers 302 can be formed for subsequent processing, such as deposition.

The test source/drain regions 108 can be formed around a test gate region 304, such as a depletion region, of the test body 110. The test gate region 304 can provide a conductive region for electrical charges, such as electrons or holes, to pass between the test source/drain regions 108. The test body 110, including the test source/drain regions 108 and the test gate region 304, can be formed over a test substrate 306 such as a buried oxide. The test substrate 306 can provide isolation for the electrical charges through the test gate region 304 and between the test source/drain regions 108.

Figure 4:
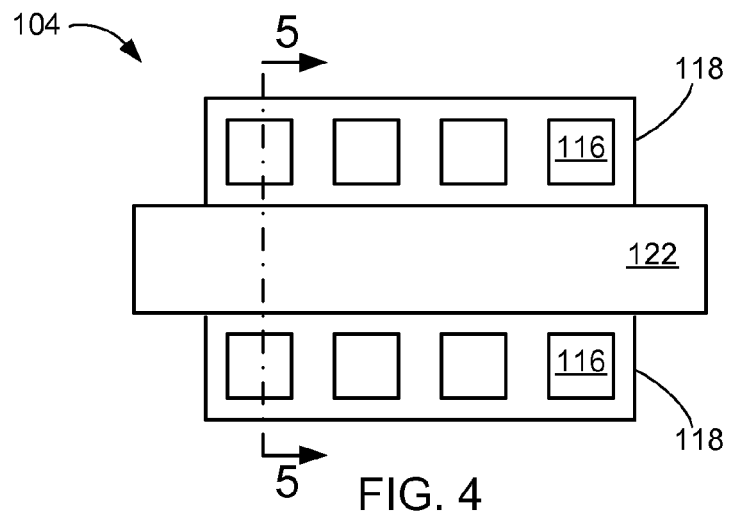
FIG. 4 is a plan view of the base structure of the integrated circuit system.

Referring now to FIG. 4, therein is shown a plan view of the base structure 104 of the integrated circuit system 100. The base structure 104 includes the base connectors 116 over the base source/drain regions 118. The base connectors 116 are formed having substantially the same dimensions and density as the test connectors 106 of FIG. 1. The base structure 104 also includes the base gate 122 formed substantially between the base source/drain regions 118.

The base gate 122 is formed having substantially the same dimensions as the test gate 112 of FIG. 1. The base gate 122 is formed over the base dielectric 124 of FIG. 1. The base connectors 116 can be connected to interconnect (now shown), such as routing, having substantially the same dimensions as interconnect connected to the test connectors 106. The base structure 104 provides extracted capacitance between the base gate 122, the base source/drain regions 118, and the base connectors 116 including interconnect (not shown).

Figure 5:
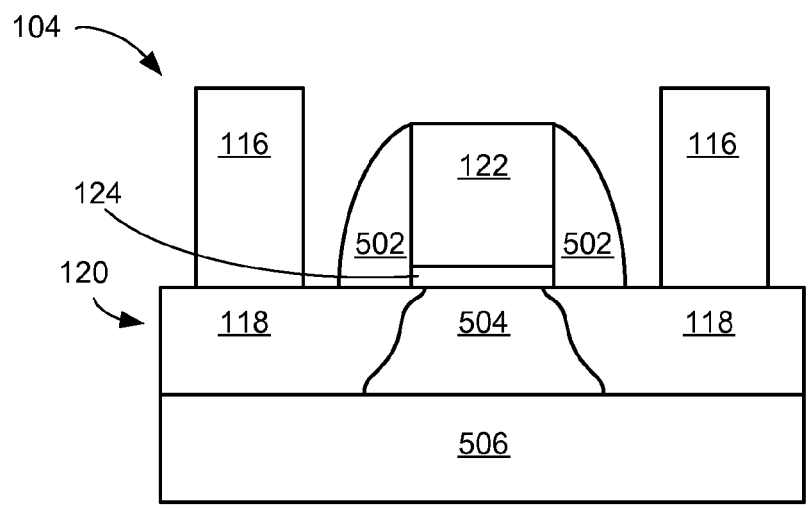
FIG. 5 is a cross-sectional view of the base structure along line segment 5-5 of FIG. 4.

Referring now to FIG. 5, therein is shown a cross-sectional view of the base structure 104 along line segment 5-5 of FIG. 4. The base structure 104 includes the base connectors 116 on the base source/drain regions 118 of the base body 120. The base gate 122 can be formed over the base dielectric 124 and substantially between the base source/drain regions 118. Base spacers 502, such as sidewall spacers can optionally be formed adjacent to the base gate 122. The base spacers 502 can be formed for subsequent processing, such as deposition.

The base source/drain regions 118 can be formed around a base gate region 504, such as a depletion region, of the base body 120. The base gate region 504 can provide a conductive region for electrical charges, such as electrons or holes, to pass between the base source/drain regions 118. The base body 120, including the base source/drain regions 118 and the base gate region 504, can be formed over a base substrate 506 such as a buried oxide. The base substrate 506 can provide isolation for the electrical charges through the base gate region 504 and between the base source/drain regions 118.

Figure 6:
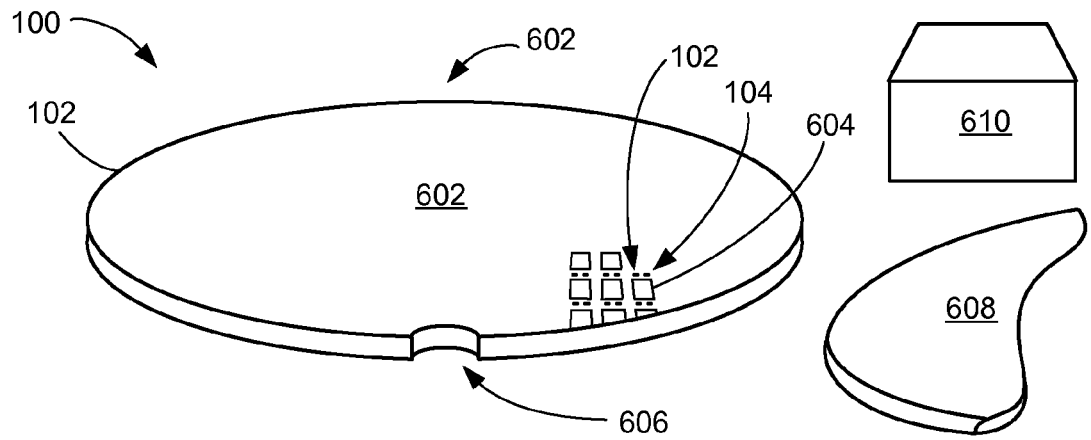
FIG. 6 is an isometric view of the integrated circuit system in a wafer processing phase.

Referring now to FIG. 6 is an isometric view of the integrated circuit system 100 in a wafer processing phase. The integrated circuit system 100 can be formed on a wafer 602, such as a silicon wafer. The integrated circuit system 100 can include the test structure 102, the base structure 104, and integrated circuit die 604. The wafer 602 can optionally include a wafer notch 606. The wafer notch 606 can determine the position or orientation of the wafer 602. The test structure 102 and the base structure 104 can be formed near the integrated circuit die 604 to provide data for a subsequent wafer 608.

The integrated circuit system 100 can also include a processing device 610 such as a testing device, a measurement device, or a simulation device. The processing device 610 can process data, such as extracted, parametric, or modeling, from the test structure 102 or the base structure 104 of the wafer 602. The data from the wafer 602 can provide design or processing data for manufacturing the subsequent wafer 608. The processing device 610 utilizing data from the test structure 102 or the base structure 104, can provide significantly improved design or simulation of subsequent integrated circuit devices (not shown) of the subsequent wafer 608.

The test gate 112 of FIG. 1, the test connectors 106 of FIG. 1, and the test source/drain regions 108 of FIG. 1 can be formed substantially the same as the base gate 122 of FIG. 1, the base connectors 116 of FIG. 1, and the base source/drain regions 118 of FIG. 1. The test connectors 106 and the base connectors 116 can be connected to test interconnect (not shown) and base interconnect (not shown). The test interconnect can be formed having substantially the same dimensions as the dimensions of the base interconnect. The only substantial difference between the test structure 102 and the base structure 104 can be the test dielectric 114 and the base dielectric 124.

The test structure 102 can provide capacitances between the test gate 112 and the test connectors 106 including test interconnect. The base structure 104 can provide capacitances between the base gate 122, the base source/drain regions 118, and the base connectors 116 including base interconnect. Subtracting the capacitance of the test structure 102, from capacitance provided by the base structure 104, results in a difference representing a gate capacitance, such as intrinsic capacitance or fringe capacitance, between only the base gate 122 and the base source/drain regions 118.

The gate capacitance calculated from the test structure 102 and the base structure 104, can provide representative capacitances for integrated circuit devices (not shown) provided by a process, such as a wafer fabrication process. The gate capacitance can provide models for simulating subsequent integrated circuit devices on the subsequent wafer 608. The improved accuracy of the gate capacitance can provide significantly improved integrated circuit device models and significantly more accurate integrated circuit simulation for subsequent integrated circuit die provided by the process.

It has been discovered that the test structure 102 isolates extra, unwanted capacitances such that extracted test capacitances of the test structure 102 can be subtracted from extracted base capacitances of the base structure 104 to deconvolve the gate capacitance or the intrinsic capacitance.

Figures 7A, 7B, 7C:
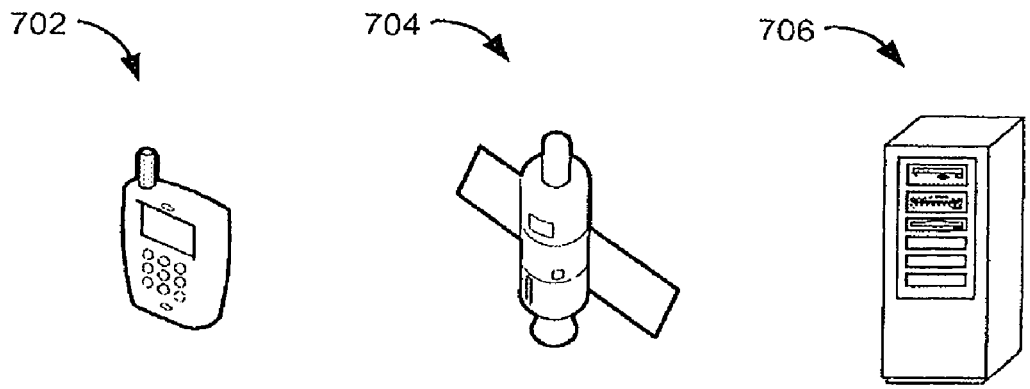
FIGS. 7A, 7B, and 7C schematic views of electronics systems as examples in which various aspects of the present invention can be implemented.

Referring now to FIGS. 7A, 7B, and 7C therein are shown schematic views of electronics systems as examples in which various aspects of the present invention can be implemented. The electronics systems can be any system performing any function including managing data: creation, transportation, transmittal, modification, storage, or combination thereof. Any of the electronics systems can include one or more subsystems. The subsystems can provide the present invention attached over printed circuit boards, mounted over substrates, or included in other electronic assemblies.

As examples, the electronics systems such as a cellular phone 702, a satellite 704, and a computer system 706 can have data management subsystems including the present invention. For example, information created, transported, or stored on the cellular phone 702 can be transmitted to the satellite 704. Similarly, the satellite 704 can transmit or modify the information and transmit or receive data to or from the computer system 706. The computer system 706 can store or modify information that can optionally be transmitted to other systems, such as the cellular phone 702 or the satellite 704.

Figure 8:
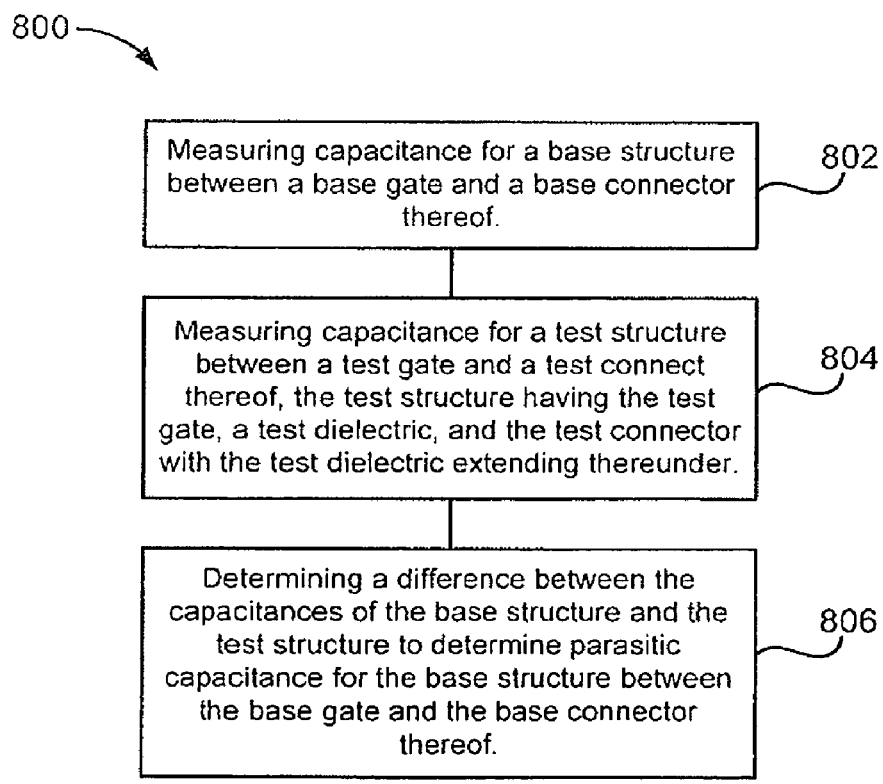
FIG. 8 is a flow chart of an integrated circuit system for manufacturing the integrated circuit system in an embodiment of the present invention.

Referring now to FIG. 8, therein is shown a flow chart of an integrated circuit system 800 for testing the integrated circuit system 100 in an embodiment of the present invention. The system 800 includes measuring capacitance for a base structure between a base gate and a base connector thereof in a block 802; measuring capacitance for a test structure between a test gate and a test connector thereof, the test structure having the test gate, a test dielectric, and the test connector with the test dielectric extending thereunder in a block 804; and determining a difference between the capacitances of the base structure and the test structure to determine parasitic capacitance for the base structure between the base gate and the base connector thereof in a block 806.

In greater detail, a system to provide the method and apparatus of the integrated circuit system 100, in an embodiment of the present invention, is performed as follows:
1. Providing a wafer.
2. Measuring capacitance for a base structure between a base gate, a source base connector, and a drain base connector thereof on the wafer.
3. Measuring capacitance for a test structure between a test gate, a source test connector and a drain test connector thereof, the test structure having the test gate, a test dielectric, the source test connector, and the drain test connector, the test dielectric extending between the source test connector and the drain test connector and the wafer.
4. Determining a difference between the capacitances of the base structure and the test structure to determine parasitic capacitance for the base structure between the base gate, the source base connector, and the drain base connector thereof.

The present invention thus has numerous aspects of different embodiments. These and other valuable aspects of different embodiments of the present invention consequently further the state of the technology.

Thus, it has been discovered that the integrated circuit system method and apparatus of the present invention furnish important and heretofore unknown and unavailable solutions, capabilities, and functional aspects for integrated circuit systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method comprising:
measuring capacitance for a base structure between a base gate and a base connector thereof;
measuring capacitance for a test structure between a test gate and a test connector thereof, the test structure having the test gate, a test dielectric, the test connector with the test dielectric extending thereunder, and a test source/drain region underlying the test connector and the test dielectric; and
determining a difference between the capacitances of the base structure and the test structure to determine parasitic capacitance for the base structure between the base gate and the base connector thereof.

2. The method as claimed in claim 1 wherein measuring the capacitance for the base structure includes measuring a capacitance between the base gate and a base source/drain region.

3. The method as claimed in claim 1 wherein determining the difference between the capacitances of the base structure and the test structure includes determining a fringe capacitance.

4. The method as claimed in claim 1 wherein measuring the capacitance for the test structure includes substantially eliminating the capacitance between the test gate and the test source/drain region.

5. The method as claimed in claim 1 further comprising predicting performance metrics for a subsequent wafer based on the difference between the capacitances of the base structure and the test structure.

6. A method comprising:
providing a wafer;
measuring capacitance for a base structure between a base gate, a source base connector, and a drain base connector thereof on the wafer;
measuring capacitance for a test structure between a test gate, a source test connector and a drain test connector thereof, the test structure having the test gate, a test dielectric, the source test connector, the drain test connector, a test source region, and a test drain region, the test dielectric extending between the source test connector and the drain test connector and the wafer, the test source region underlying the source test connector, and the test drain region underlying the drain test connector; and
determining a difference between the capacitances of the base structure and the test structure to determine parasitic capacitance for the base structure between the base gate, the source base connector, and the drain base connector thereof.

7. The method as claimed in claim 6 wherein measuring the capacitance for the base structure includes measuring a capacitance of the base gate to the source base connector, the drain base connector, and a base source/drain region.

8. The method as claimed in claim 6 wherein determining the difference between the capacitances between the base structure and the test structure includes determining a fringe capacitance between the base gate and a base source/drain region.

9. The method as claimed in claim 6 wherein measuring the capacitance for the test structure includes substantially eliminating the capacitance of the test gate to the test source region and the test drain region.

10. The method as claimed in claim 6 further comprises simulating integrated circuits for a subsequent wafer based on the difference between the capacitances of the base structure and the test structure.

11. A test system comprising:
a base structure for having capacitance measured between a base gate and a base connector thereof; and
a test structure for measuring capacitance between a test gate and a test connector thereof, the test structure having the test gate, a test dielectric, the test connector with the test dielectric extending thereunder, and a test source/drain region underlying the test connector and the test dielectric, and the test structure used to determine a difference between the capacitance of the base structure and the test structure to determine parasitic capacitance for the base structure between the base gate and the base connector thereof.

12. The system as claimed in claim 11 wherein the test structure includes a capacitance, between the test gate and the test source/drain region, substantially eliminated.

13. The system as claimed in claim 11 further comprising:
a wafer; and
wherein:
the base structure on the wafer includes a source base connector and a drain base connector; and
the test structure on the wafer for having capacitance measured between the test gate, a source test connector and a drain test connector thereof, the test structure having the test gate, the test dielectric, and the source test connector and the drain test connector, the test dielectric extending between the source test connector, the drain test connector and the wafer, and the test structure used to determine the difference between the capacitance of the base structure and the test structure to determine parasitic capacitance for the base structure between the base gate, the source base connector, and the drain base connector thereof.

14. The system as claimed in claim 11 further comprising a processing device for designing integrated circuits.

15. The system as claimed in claim 11 further comprising a processing device for modeling integrated circuits.

16. The system as claimed in claim 13 further comprising a processing device for testing the wafer.

17. The system as claimed in claim 13 wherein the test structure includes a capacitance between the test gate, a test source region, and a test drain region, substantially eliminated.

18. The system as claimed in claim 13 further comprising a processing device for extracting parametric data from the wafer.

19. The system as claimed in claim 13 further comprising a processing device for simulating integrated circuits of a subsequent wafer.

20. The system as claimed in claim 13 further comprising a processing device for creating simulation models for integrated circuits of a subsequent wafer.

* * * * *